United States Patent [19]
Adair et al.

[11] Patent Number: 5,506,080
[45] Date of Patent: Apr. 9, 1996

[54] LITHOGRAPHIC MASK REPAIR AND FABRICATION METHOD

[75] Inventors: William J. Adair, Underhill; David S. O'Grady, Jericho; Willam C. Joyce, Essex Junction; James J. Lynch, Charlotte; Jean T. Ohlson, Underhill Center, all of Vt.

[73] Assignee: Internation Business Machines Corp., Armonk, N.Y.

[21] Appl. No.: 376,570

[22] Filed: Jan. 23, 1995

[51] Int. Cl.⁶ .................................................. G03F 9/00
[52] U.S. Cl. .......................... 430/5; 430/322; 430/324; 430/394
[58] Field of Search .......................... 430/5, 322, 324, 430/394

[56] References Cited

U.S. PATENT DOCUMENTS

| | | | |
|---|---|---|---|
| 3,506,441 | 4/1970 | Gottfried | 96/36.2 |
| 4,698,236 | 10/1987 | Kellogg et al. | 427/43.1 |
| 4,820,898 | 4/1989 | Slingerland | 219/121.12 |
| 4,851,097 | 7/1989 | Hattori et al. | 204/192.33 |
| 4,950,498 | 8/1990 | Kaito | 427/38 |
| 5,246,799 | 9/1993 | Pierrat | 430/4 |
| 5,362,591 | 11/1994 | Imai et al. | 430/5 |
| 5,382,484 | 1/1995 | Hosono | 430/5 |

OTHER PUBLICATIONS

Repair of Mask–Caused Defects In A Positive–Working Photoresist Pattern IBM Technical Disclosue Bulletin, vol. 8, No. 6, Nov. 1965, pp. 861–862.
Fabrication Of Defect–Free Masks IBM Technical Disclosue Bulletin, vol. 9, No. 10, Mar. 1967, pp. 1381–1382.
Blocking Process For Photoresist IBM Technical Disclosue Bulletin, vol. 16, No. 1, Jun. 1973, p. 47.

*Primary Examiner*—S. Rosasco
*Attorney, Agent, or Firm*—Thornton & Thornton; Lawrence Meier

[57] ABSTRACT

A method of forming a substantially defect-free mask for optical and phase-shift lithography. The method involves depositing a transfer layer on a mask layer deposited on a transmissive substrate, forming in the transfer layer a mask image to be defined in the mask layer, inspecting the image formed in the transfer layer, repairing the image formed in the transfer image, and transferring the corrected image from the transfer layer into the mask layer. The repair of the transfer layer is accomplished by removing unwanted portions of the transfer layer followed by filling any unwanted voids therein with a selected material. Preferably, the fill material has the same desirable etching and/or optical characteristics as the surrounding transfer layer. However, any material that is substantially opaque to the radiation used to transfer the image from the transfer layer to the mask layer can be successfully employed.

13 Claims, 4 Drawing Sheets

LITHOGRAPHIC MASK REPAIR AND FABRICATION METHOD

FIELD OF THE INVENTION

This invention relates to photo-lithography and, more particularly, to an improved method of making and repairing photo-lithographic masks that use a transfer agent to define the desired mask configuration.

BACKGROUND OF THE INVENTION

Photo-lithography, using either positive or negative emulsions, is used to define images in a mask layer of material deposited on a glass plate or substrate. This technique is widely used in the semiconductor industry to form a wide range of structures in integrated circuit chips. As the size of the production runs of such integrated circuit chips increased and as automatic mask handling equipment came into wide use, it became necessary to provide the images in a mask layer of hard, abrasion-resistant material, such as a metal (typically a deposit of chrome), deposited on the surface of the substrate. The material used as the mask layer, must be imagable with a high resolution such that the desired image can be readily and easily defined therein.

Although such metallic coated masks have a long production life, they require the use of a transfer agent, e.g., a photoresist layer, in which the desired image is first formed and from which the image can be transferred into the mask layer. As the chip feature size decreases, it becomes increasingly difficult to provide perfect masks. This occurs because very small particles of foreign material, bubbles in the photoresist, or other anomalies approach the size of the image to be formed in the transfer layer. These defects prevent proper resist exposure or alter the effects of the developer on the exposed photoresist. This results in unwanted patterns being created in the exposed and developed photoresist. In the prior art processes, such unwanted patterns are transferred into the mask layer. These defects are especially troublesome in phase shift masks.

To correct for such errors in the mask layer, elaborate and expensive mask inspections and processes for the repair of the defined images in the metallic mask layer have been created. Such repair procedures require modification of either the surface of the mask layer or the surface of the substrate. The prior art repair techniques require treatments, such as ion beam sputtering or laser beam ablation to remove unwanted mask layer material from the surface of the substrate, in areas designed to be fully transmissive, or the deposition of additional, suitably opaque, material in the those areas designed to be opaque. These repair techniques typically yield either unacceptable results, or introduce undesirable phase or transmission defects in the final mask.

Accordingly, there now exists a need for an improved mask making process that avoids the problems of the prior art and that substantially eliminates the need for repair processes that tend to introduce undesirable defects in the final mask.

SUMMARY OF THE INVENTION

An object of the present invention is to provide an improved mask making process that does not induce defects in either the printing or non-printing regions of the mask.

It is another object of the invention to provide a mask making process that substantially eliminates the need for the conventional repair techniques of the final mask images, as now practiced in the semiconductor mask-making art.

It is yet another object of the invention to provide a novel method of fabricating a defect-free final mask image in a mask structure using conventional mask materials and techniques.

These desirable results and other objects of the present invention are realized by depositing a transfer layer on a mask layer deposited on a transmissive substrate, forming in the transfer layer the desired image, inspecting the image in the transfer layer, repairing the image in the transfer layer, and transferring the corrected image from the transfer layer into the mask layer or substrate.

The repair of the image in the transfer layer is accomplished by removing unwanted portions of the transfer layer and/or back filling any voids with a selected material. Preferably, the back fill material should have the same chemical, physical and/or optical characteristics as the surrounding transfer layer and be readily removable.

These and other objects, features, and advantages of the invention will be apparent from the following more particular description of the preferred embodiment of the invention, as illustrated in the accompanying drawings.

DESCRIPTION OF THE PREFERRED EMBODIMENT

Figure 1:
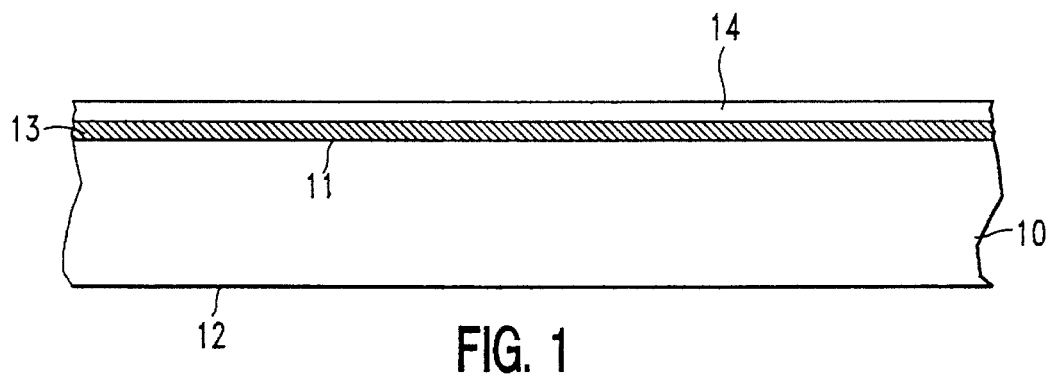
FIG. 1 shows an optically flat photomask blank having a mask layer deposited thereon and overcoated with a transfer layer.

The present invention, as will be more fully set forth below, is a method of fabricating a photomask consisting of transmissive regions with regions less transmissive located adjacent thereto.

Referring now to the drawings and especially FIGS. 1 to 8, the method of the invention will be described in conjunction with the fabrication of an optical phase-shift photomask, suitable for use in the production of semiconductor integrated circuit chips. FIGS. 1 through 7 are sectional views showing a preferred manufacturing process for producing such a phase shift mask using the present invention. FIG. 8 shows, in section, the completed phase-shift mask created by the processing steps described in conjunction with FIGS. 1 to 7.

FIG. 1 shows an optically flat and optically transmissive photomask blank 10 typically having a thickness of between 0.050 and 0.500 inches and substantially parallel major surfaces 11 and 12. Quartz or borosilicate glass is the preferred material for the blank 10 when wavelengths between 1 micron and 10 microns are to be transmitted therethrough. Quartz is especially preferred not only because of its low thermal expansion coefficient but also because it is very transparent, i.e., has a high light transmissivity, from the deep ultra-violet having a wavelength between 18 and 400 nanometers, the ultra-violet, the visible spectrum and into the infra-red below 7 microns. Transmissivity is the ratio of the transmitted light,-passing through a definite thickness of the material, to the incident light. As used herein, a high transmissivity material is one that transmits 50% or more of the incident light and a low transmissivity material is one that transmits 35% or less of the incident light. For example, in the deep ultra-violet range for light with a wavelength of 19 nanometers, the transmission factor or transmissivity for a 1 mm thick quartz blank is about 67% and for light having a wavelength of 22 nanometers the transmissivity is 94%. It should of course be understood that other materials having the necessary characteristics such as a suitable refractive index and transmissivity, for the incident light of interest, can be used.

Disposed on top surface 11 is a durable, image definable, substantially opaque mask layer 13. As used herein, "substantially opaque" means a material through which less than 0.1 percent, of the optical radiation of interest can pass. Preferably this layer is made of a metal such as a chromium, and is generally formed by sputter or vapor phase deposition techniques. In present day mask making processes, a layer of chromium 100 to 10,000 Å in thickness is generally used. Chromium is especially preferred due to its wide use in the semiconductor mask-making industry and because there is available a large body of information regarding its characteristics together with equipment for various methods of its deposition, etching, inspection and repair. Other suitable materials for layer 13 include molybdenum, aluminum, tungsten, titanium and various oxides of the above metal in appropriate thicknesses as well as carbon, silicon nitride and various silicon based compounds. However, it should be understood that any material can be used so long as (1) it is compatible with the gasses and chemicals used in the mask fabrication process and, (2) when laid down in the thinnest layer possible will support a sharp definition of the image to be created in the mask, (3) will be substantially opaque to the radiation needed to define the mask image and the radiation used with the completed mask and (4) is a durable material that will have a long production life. The material selected and its thickness will, of course, vary as necessary to meet the required uses of the mask as well as the required processing steps necessary to create the mask.

Figure 2:
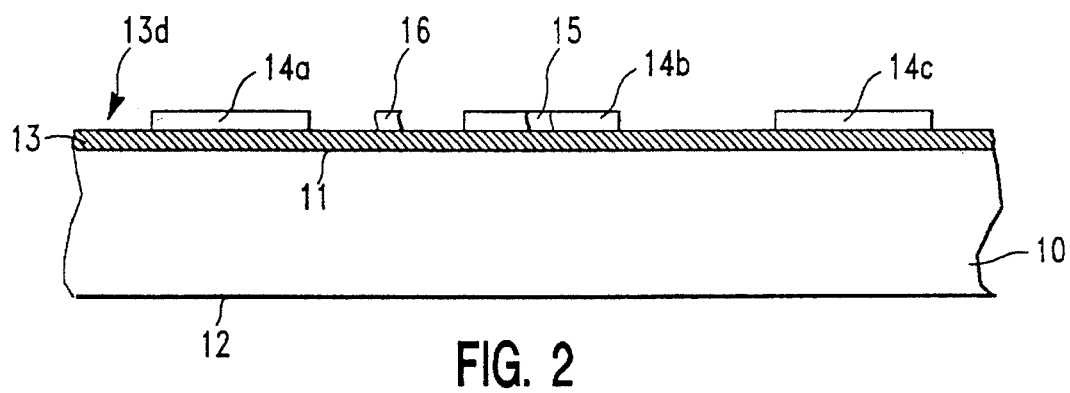
FIG. 2 shows the blank of FIG. 1 with the overcoated transfer layer defined into a selected image.
Figure 3:
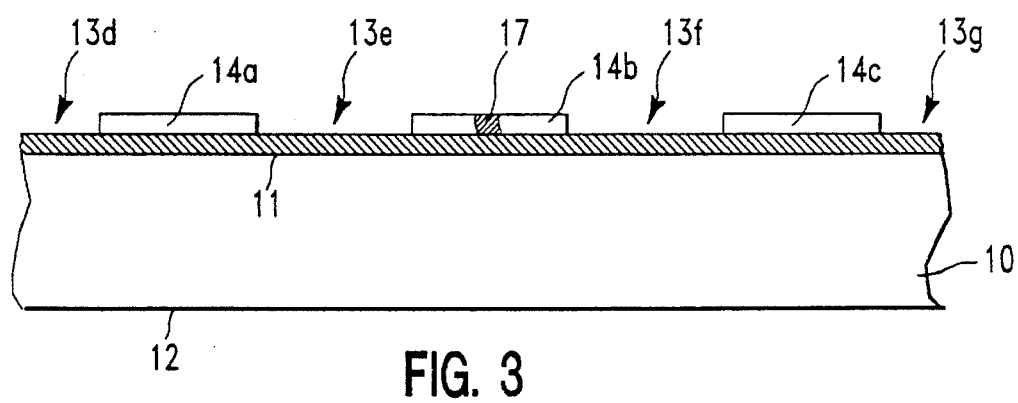
FIG. 3 shows the blank of FIG. 2 after the transfer layer has been inspected and corrected.

Once deposited, this layer 13 is over coated with a transfer layer 14. Such transfer layers are an image definable, sacrificial or fugitive film, e.g., photoresist. In the present example a positive photoresist such as is sold by the Shipley Company under the trade name AZ-1350H, is used as the image transfer layer 14. As shown in FIG. 2, this layer 14 is exposed to the desired image and developed, by known photoresist exposure and development techniques, to create the desired image therein. Other suitable photoresists are presently commercially available and well known to the semiconductor art. It should also be noted that other suitable image definable materials can be used as the transfer layer 14. The photoresist or other material selected must be impervious to the etchants and processes used to transfer and define the mask layer 13. This is required because the transfer layer 14 must serve as protection for any underlying areas of mask layer 13 during the subsequent steps required to transfer the image from the transfer layer 14 into the mask layer 13. As illustrated in FIG. 2, the exposure and development of the image in the photoresist transfer layer 14, by processes well known to the art, leaves a series of spaced apart islands 14a, 14b, and 14c on the surface of the mask layer 13 in which the final mask image is to be replicated.

As discussed above, during the deposition and subsequent patterning (exposure and development) steps of the transfer layer 14, defects can occur therein. Such defects can, after development, appear, for example, as a pinhole 15 (FIG. 2) in the transfer layer island 14b or as the converse, i.e., an unwanted or excess deposit of island 16 occurring between the islands 14a and 14b. Such undesired deposits 16 are ones that appear in areas that are supposed to be clear.

In the prior art, such defects in the transfer layer were left untreated, causing the image transferred therefrom into the mask layer to contain the same defects. In such a case, the former defect (i.e., the hole 15) results in an identical hole being replicated in the underlying layer mask 13 and the latter defect (i.e., the excess deposit 16) results in a deposit of mask material remaining where none is desired. If negative photoresist is used the converse is true.

The prior art, to correct such replicated defects in the mask layer 13, developed elaborate inspection and repair techniques. Such apparatus and techniques are shown, for example, in U.S. Pat. Nos. 4,820,898; 4,851,097 and 4,950, 498. These processes involved back filling the pinholes in the layer 13 with deposits of a opaque material such as carbon or chrome and removing any unwanted deposits 16 off the substrate surface by ion milling or laser ablation.

These prior art processes, when applied to the mask layer 13, only partially correct the replicated defects especially when the mask is a phase-shift mask. Such failures occur because the materials used for back filling the pinholes in the mask layer 13 have different optical characteristics than the surrounding original deposits. This difference is due both to the methods of deposition and the composition of the material used to fill the pinholes as well as the difference in thickness between the fill material and the surrounding original layer 13. Such differences can alter the characteristic of the mask layer 13, thus altering the devices made with such a repaired mask. To date, the prior art has not taught how material having the same composition and thickness as the surrounding mask layer can be deposited in such pinholes. The ion milling or laser ablation of a selected portion of the mask layer off the surface of a phase shift mask substrate can result in a phase defect due to erosion of the substrate surface.

The present invention avoids these adverse effects by repairing the photoresist or transfer layer 14 before the image, defined in the photoresist layer 14, is transferred into or replicated in the underlying layer 13. By repairing the image created in the transfer layer 14 before the image is replicated in the underlying layer 13, all the above defects of transmissivity and phase defects are avoided in the mask layer 13. This approach eliminates the necessity of repair of the mask layer 13, thereby avoiding the possibility of creating phase or transmission defects in the completed masks.

The present invention achieves these results by: inspecting the transfer layer 14 after it is exposed and developed as shown in FIG. 2, using any one of a number of suitable inspection systems now available in the market place and known to the prior art; precisely locating each defect in the transfer layer 14, (i.e., each pinhole 15 and excess deposit 16); filling in the pinholes 15 with a material having suitable physical chemical and optical characteristics; and removing the excess portions 16.

Once the defects in the transfer layer 14 are found and precisely located, the transfer layer is repaired. In the case of ion beam milling blank 10 is placed on the object table of a focused ion beam mask repair tool (not shown) such as the model 808 ion beam apparatus sold by the Micrion Company. This table is positioned in the beam chamber of the apparatus and is movable in both the X and Y directions for moving the areas on the substrate to be worked under the ion beam generated by the apparatus. Once the blank is secured to the table the beam chamber is sealed and evacuated to a suitable low pressure of about 0.01 Torr.

It was found that the excess photoresist deposits 16 were easily removed at a rate of about 1.0 square micron per second, in the above described model 808 apparatus when the beam voltage is at 25 KV, the applied dose at 0.8 nano-coulombs per square micron, the aperture at 200 microns, the pixel spacing at 200 microns and the dwell time per pixel at 2 microseconds.

Similarly, pinholes 15 were found to be filled in at a rate of 1.5 square microns per second when the apparatus, at the above described settings, had a styrene gas, at a flow rate of 0.5 liters per minute, introduced into the evacuated chamber in the presence of the ion beam. Under the influence of the ion beam, the styrene gas is caused to breakdown and carbon extracted therefrom. In the presence of the beam this carbon forms a deposit 17 (FIG. 3) filling the pinhole 15 and causing the island 14b to again become a unitary protective layer.

It should be noted that instead of ion milling the excess deposit 16 off the surface 11 as described above, the deposit 16 could be exposed by the beam and then removed by a second development step.

Figure 4:
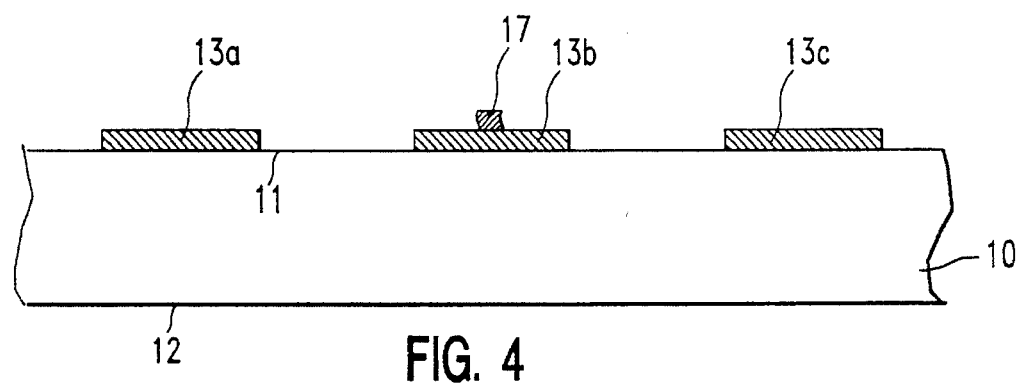
FIG. 4 shows the mask layer after being defined with the selected image set in the transfer layer.

Once the above treatments have been applied to correct the defects in the transfer layer 14, the blank is removed from the apparatus. The blank is then treated to remove the mask layer areas 13d, 13e, 13f, and 13g (see FIG. 3) not covered by the transfer layer islands 14a, 14b, and 14c. Removal of these areas 13d, 13e, 13f, and 13g effects the transfer of the image, from the transfer layer 14, to the mask layer 13 and leaves chrome mask layer islands 13a, 13b, and 13c identical to the transfer layer islands 14a, 14b, and 14c, as illustrated in FIG. 4. The image defined in the transfer layer 14 is thus replicated in the mask layer 13. The preferred method of accomplishing this removal, of the chrome areas 13d, 13e, 13f, and 13g, when the latter is made of chrome, is by reactive ion etching (RIE) using a chlorine and oxygen ambient. A wet etching technique may also be appropriate.

Following the transfer of the image in the transfer layer 14 into the mask layer 13, the transfer islands 14a, 14b, and 14c are removed from the surface of the defined mask layer areas 13a, 13b, and 13c. It should be noted that removal of the transfer island 14b does not necessarily remove the carbon deposit 17 which was used to fill the pinhole 15. If the process used to remove the island 14b does not simultaneously remove the carbon deposit 17, the blank can again be placed in the ion beam or laser ablation apparatus and the carbon deposit 17 remaining on the region 13b removed by ion milling, as described above. Once the carbon deposit 17 has been removed, a mask suitable for use in production, as shown in FIG. 4, has now been created and the mask at this point can now be so used.

Once the areas 13a, 13b, and 13c have been defined they can again be inspected. However, if the transfer layer 14 was properly inspected and repaired no defects will be found in the areas 13a, 13b, and 13c.

Figure 5:
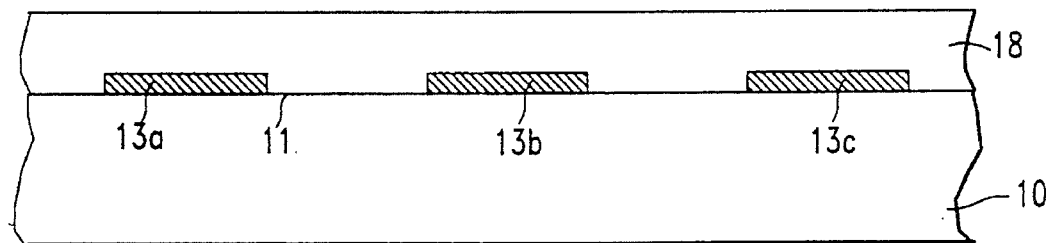
FIG. 5 shows the blank of FIG. 4 overcoated with a second level transfer layer.
Figure 6:
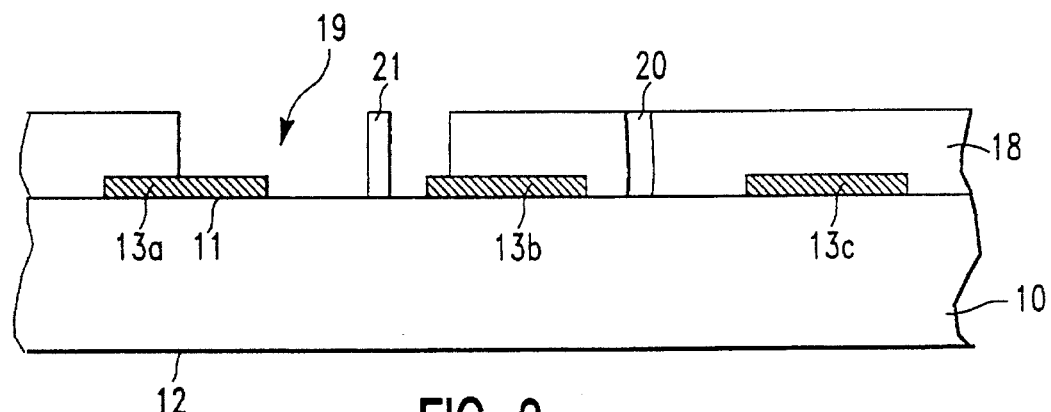
FIG. 6 shows the blank of FIG. 5 with a second image defined in the second transfer layer.

Referring to FIG. 5, if the mask fabricated by the steps discussed above is to be now made into a phase shift mask, several different techniques can be employed. In the preferred process, a second transfer layer 18, e.g., photoresist, is applied over the surface of the mask. This second transfer layer 18 is now defined with a second image therein. It should be noted that, for purposes of illustration, the present example shows only a single opening 19 in the transfer layer to expose only a selected region of the mask, as illustrated in FIG. 6. However many such openings can and usually are made in the transfer layer. As will be further explained below, the opening 19 need not be so closely defined as to expose only the surface between the areas 13a and 13b, but can also expose portions of the surface of the areas 13a and 13b.

The defined transfer layer 18 is now inspected as described above and again it will be assumed that defects such as a undesired opening 20 and an unexpected inclusion 21 is found as illustrated in FIG. 6. The inspected unit is again treated and, as described above, the opening 20 is again filled with a suitable material 22 and the inclusion 21 removed as previously described.

Figure 7:
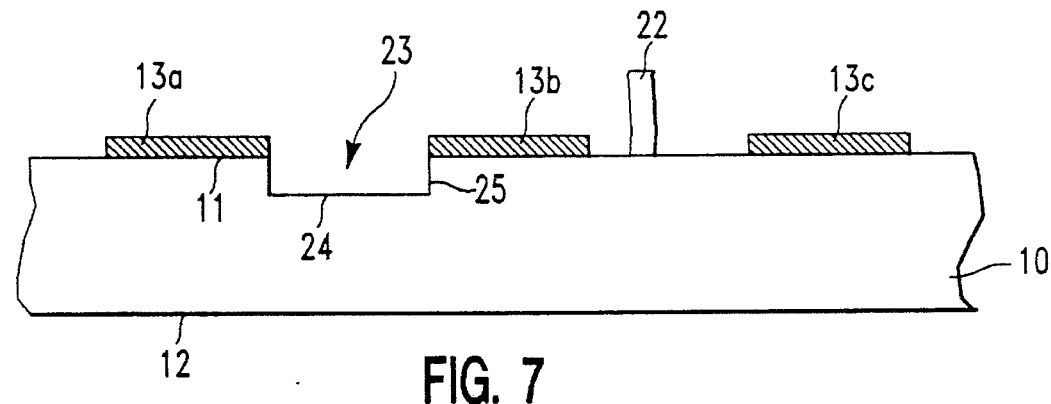
FIG. 7 shows the blank of FIG. 6 with the second transfer layer corrected and removed and after a phase shift recess has been defined in the blank.
Figure 8:
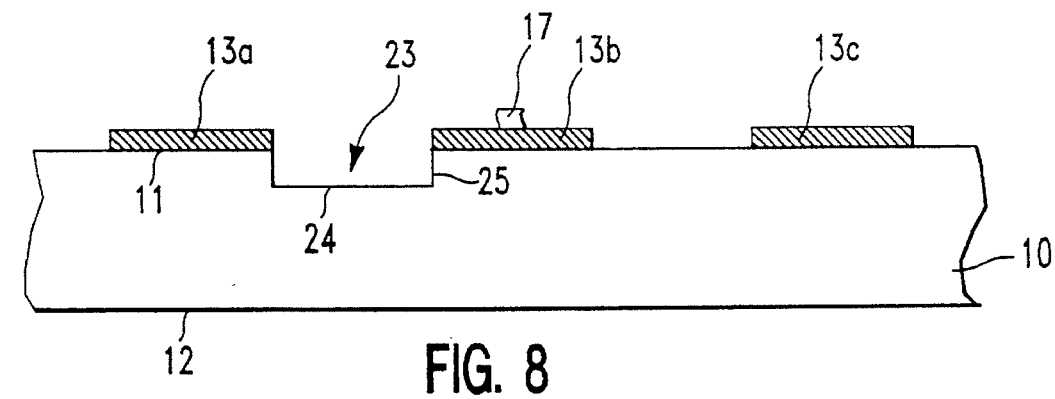
FIG. 8 shows the blank of FIG. 7 fully processed and existing as a phase defect free mask useful for the fabrication of an integrated circuit.

As illustrated in FIG. 7, the mask with the corrected transfer layer 18 is now subjected to a suitable etching process such that the area of the surface 11 unprotected by either the second transfer layer 18 or the chrome layers 13a and 13b are now etched to create a recess 23 in surface 11. The recess 23 has substantially vertical sidewalls 25 and a substantially flat bottom 24. The recessed region 23 is preferably formed using an anisotropic reactive ion etching (RIE) process that will etch the exposed quartz substrate without etching or undercutting the chrome areas 13 or the second photoresist transfer layer 18. Reactive ambients such as a halogen or halogen-based compounds may be used, with materials such as fluorine, or carbon tetrafluoride ($CF_4$) or carbon trifluoride ($CHF_3$) being especially preferred for etching quartz or oxides without etching the chrome. Both the second transfer layer 18, when formed of photoresist, and the mask layer 13, when formed of chrome, are unaffected by these RIE etchants. Thus the mask layer 13 and the second transfer layer 18 act together to protect the underlying original surface 11 and define the width of the recesses 23. As a result of the anisotropic nature of this RIE process, the sidewalls 25 of the recess 23 are sharply defined and are substantially perpendicular to the surface 11.

Once the recess 23 is formed, the second transfer layer 18 is stripped from the mask surface and, as described above, any remaining fill material 22 is also removed, creating the phase shift mask as shown in FIG. 8.

It should be noted that the substrate 10 can be coated with a suitable phase shifting material prior to the deposition of the chrome layer 13 and the recess 23 can be formed by etching through this phase shift layer.

Figure 9:
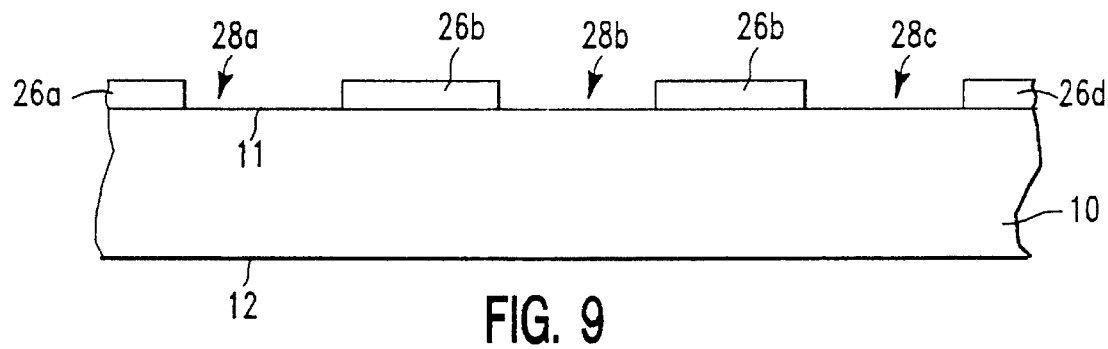
FIG. 9 shows an optically flat photomask blank overcoated with a transfer layer.
Figure 10:
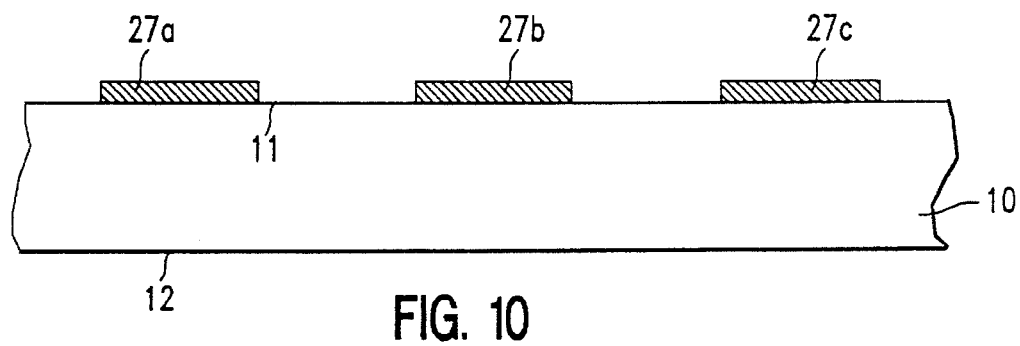
FIG. 10 shows a mask layer deposited on the blank of FIG. 9 as it would appear after the overcoated transfer layer has been removed.

The above process was described using a positive resist for the transfer layer but it should be noted that a negative photoresist could be used. It should also be noted the substrate need not be initially coated with a low light transmissivity material, i.e., the mask layer 13, but instead this layer could be deposited on the surface after definition of a suitable image in the transfer layer. This process is shown in FIGS. 9 and 10. FIG. 9 shows a blank 10 with an image defined negative photoresist 26 disposed on its upper surface 11. The defined image, shown in this Figure, is the negative of the image shown in FIG. 3 and thus is formed of islands 26a, 26b, 26c, and 26d to define openings 28a, 28b and 28c. Following the definition and correction of the image as taught above, a suitable low transmissivity material 27 is deposited on the surface of the photoresist islands 26a, 26b, 26c, and 26d and the blank surface 11 in the openings 28a, 28b, and 28c. Following this definition the photoresist islands 26a, 26b, and 26c are then stripped off leaving islands 27a, 27b, and 27c, as shown in FIG. 10.

Figure 11:
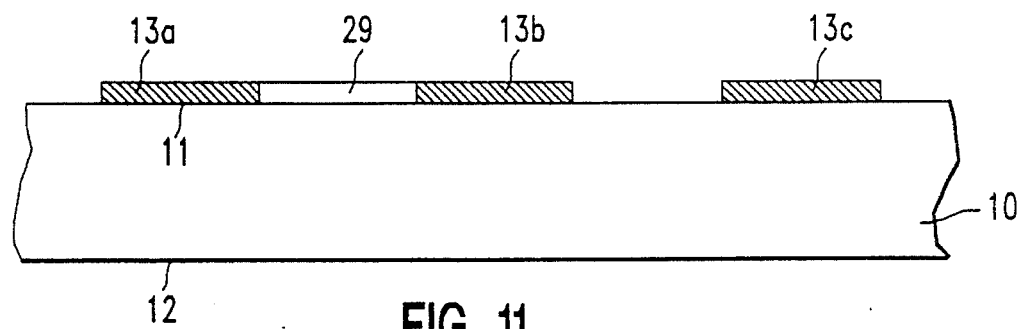
FIG. 11 shows the blank of FIG. 5 fully processed with an optical phase shifting material deposited in a selected area adjacent the defect-free mask of the invention and ready for the fabrication of an integrated circuit.
Figure 12:
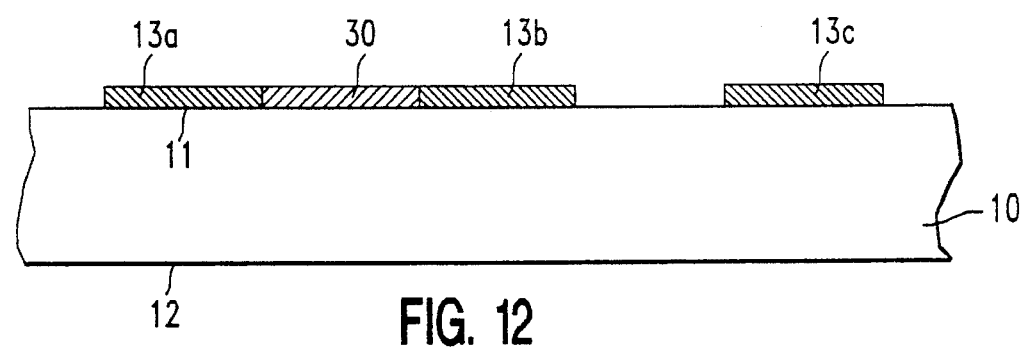
FIG. 12 shows the blank of FIG. 5 fully processed with an attenuating material deposited in a selected area adjacent the defect-free mask of the invention and ready for the fabrication of an integrated circuit.

Instead of forming the recess 23 as shown in FIG. 7, to form a phase shifting mask, a phase shifting material 29, illustrated in FIG. 11, such as additional quartz or an oxide, can be placed on the surface 11 between the islands 13a and 13b, as shown in FIG. 11. An alternate method employs an attenuator layer 30 deposited on the exposed surface 11 between the island 13a and 13b, as shown in FIG. 12. As used herein, attenuator means a material through which more than 0.1 percent but less than 20 percent, of the optical radiation of interest can pass.

Figure 13:
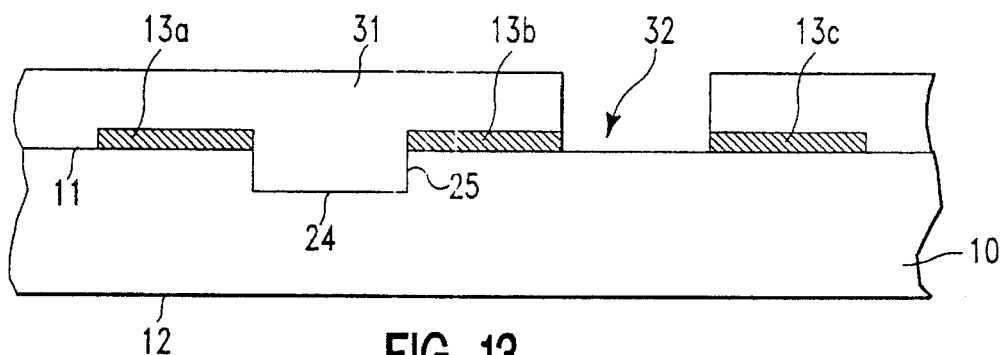
FIG. 13 shows the blank of FIG. 8 further processed with an additional transfer layer deposited over the blank formed mask to permit further processing of the previously defined image.

FIG. 13 shows the blank of FIG. 8 with an additional transfer layer deposited over the formed mask to permit further processing. This figure was created by applying a second transfer layer 31 over the formed areas 13a, 13b, and 13c and the phase shift recess 23 and forming and correcting an opening 32 therein.

Figure 14:
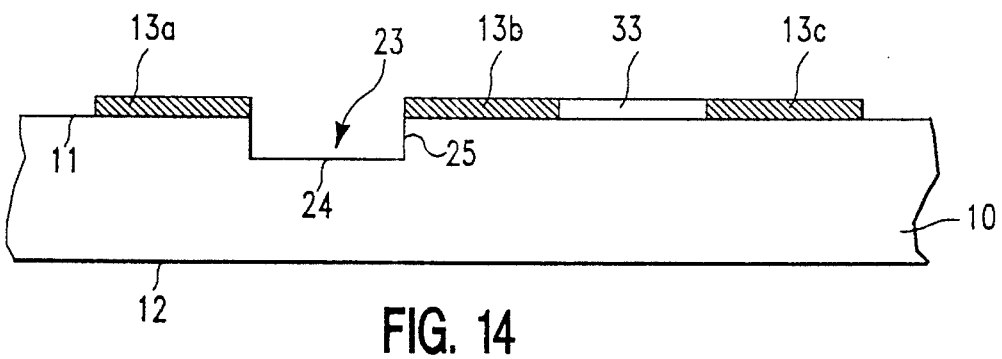
FIG. 14 shows the blank of FIG. 13 further processed with additional optical phase shifting material deposited on selected areas of the mask shown in FIG. 13 and ready for use in the fabrication of an integrated circuit.

FIG. 14 shows the blank of FIG. 13 with additional optical phase shifting material 33 deposited between the islands 13b and 13c. It should thus be obvious to one skilled in the art that many such variations can be made using the present invention.

When the image layer is formed, for example of an attenuating material, the transfer layer is usually formed of a substantially opaque material. In such a case a frame or border of the transfer layer may be left around the defined image thus aiding in stepper alignment.

Figure 15:
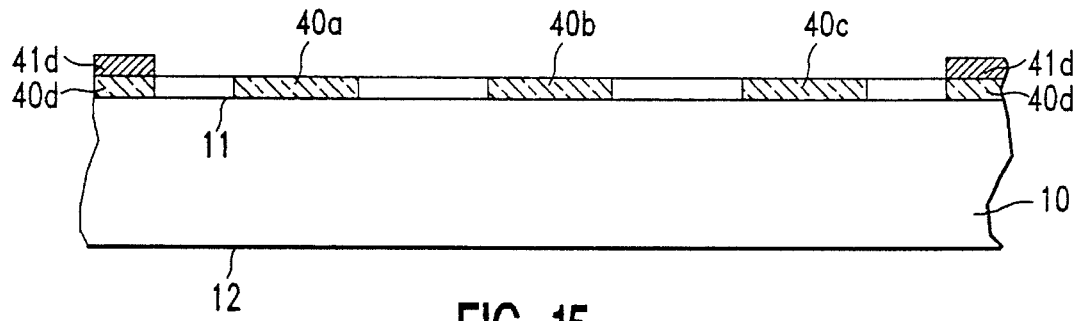
FIG. 15 shows a sectional view of a processed blank such as shown in FIG. 10 in which a frame of material is left around the areas of interest.

FIG. 15 shows a sectional view of such a processed blank wherein the islands 40a, 40b, and 40c and the surrounding lower frame are formed of an attenuating material, such as carbon. These islands are formed using the transfer method previously described. To create such a device the substrate is first coated with a layer of carbon, overcoated with a layer of chrome 31 which is then covered with a layer of photoresist. The photoresist and chrome layers are then patterned and corrected following which the photoresist is removed. Once the photoresist is removed the carbon layer is patterned using the chrome as the transfer medium. Once the islands 40a, 40b, and 40c are formed, within the frame, the chrome overlying these islands is removed. However the chrome is, as shown in FIGS. 14 an 15, left as a frame 41d around the islands.

Figure 16:
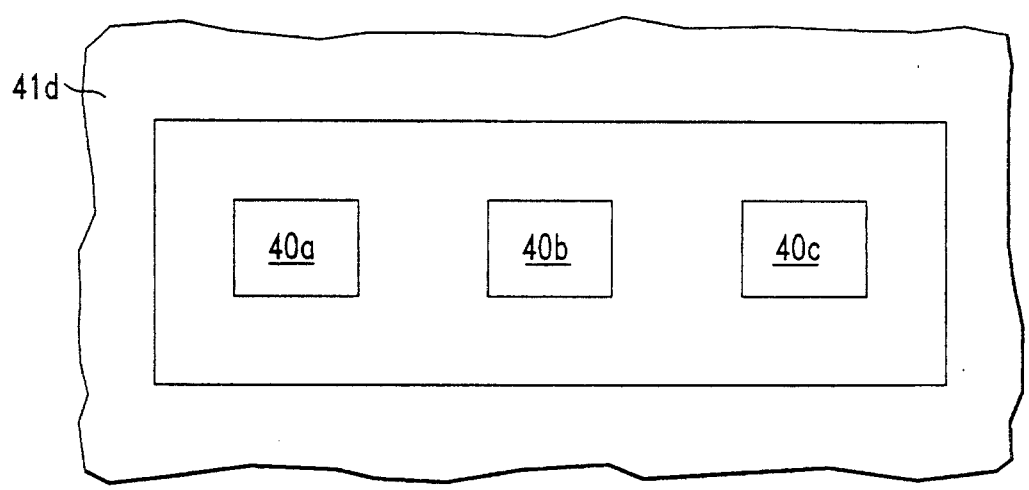
FIG. 16 shows a top view of the blank of FIG. 15.

FIG. 16 shows a top view of the blank of FIG. 15. Leaving such a frame leads to distinct advantages in such attenuating masks.

It should be noted that the operating parameters for the preferred embodiment set forth above may vary from those required for other applications due to variations in the apparatus, materials and processes used. Thus these operating parameters may need to be adjusted as a function of the characteristics of the actual transfer material and mask material used.

This completes the description of the preferred embodiment of the invention. Since changes may be made in the above process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A method of forming a lithographic mask having high light transmittance regions and low light transmittance regions, the method comprising the steps of:
    a) providing a substrate having a high light transmissivity;
    b) coating a selected surface of said substrate with a material having a low light transmissivity;
    c) providing a transfer layer on said material;
    d) forming an image in said transfer layer;
    e) inspecting said image in said transfer layer and correcting defects found therein; and
    f) transferring said image in said transfer layer to said layer of material.

2. The method of claim 1 there is further provided the steps of:
    a) providing portions of said surface of said substrate with a material having a low light transmissivity; and
    b) correcting defects found in said image in said transfer layer by adding additional material to, or removing material from said transfer layer.

3. A method of forming a structure having high light transmittance regions and low light transmittance regions, the method comprising the steps of:
    a) providing a substrate having a high light transmissivity;
    b) providing a transfer layer on a surface of said substrate;
    c) forming an image in said transfer layer to expose selected areas of said surface;
    d) inspecting said image and correcting defects found therein; and
    e) transferring said image in said transfer layer to said substrate.

4. The method of claim 3 wherein said image is transferred from said transfer layer to said substrate by depositing a high transmissivity material on said selected surface areas.

5. The method of claim 3 wherein said image is transferred from said transfer layer to said substrate by depositing an attenuating material on said exposed surface areas.

6. The method of claim 3 wherein said image is transferred from said transfer layer to said substrate by depositing an optical phase shifting material on said exposed surface areas.

7. A method of forming a structure having high light transmittance regions and low light transmittance regions, the method comprising the steps of:

a) providing a substrate having first and second parallel major surfaces and a high light transmissivity;

b) coating said first surface with a low light transmittance layer;

c) providing a first transfer layer on said low light transmittance layer;

d) forming a first image in said first transfer layer to expose a selected area of said low light transmittance layer;

e) inspecting said first image in said first transfer layer and correcting any errors in said first image by adding material to, or removing portions of, said first transfer layer;

f) transferring said corrected first image, in said first transfer layer, to said low transmittance layer by removing said exposed selected area of said low light transmittance layer to expose selected areas of said first surface of the substrate;

g) removing said first transfer layer including said added material;

h) providing a second transfer layer over said exposed selected areas of said first surface and said low transmittance layer;

i) forming a second image in said second transfer layer;

j) inspecting said second image in said second transfer layer and correcting any errors in said second image by adding material to, or removing portions of, said second transfer layer;

k) transferring said corrected second image in said second transfer layer to said exposed first surface in said selected areas by altering said exposed first surface in said selected areas; and l) removing said second transfer layer including said added material.

8. The process of claim 7 wherein said selected areas of said first exposed surface are altered by etching said selected areas to form a recess in said substrate, said recess being defined by a bottom and one or more sidewalls.

9. The process of claim 7 wherein said exposed selected areas of said first surface are altered by depositing an optical phase shifting material on said selected areas.

10. The process of claim 7 wherein said exposed selected areas of said first surface are altered by depositing an attenuating material on said selected areas.

11. The process of claim 9 wherein said thickness of said substrate, the depth of said recesses and said light transmissivity of said optical phase-shifting material are selected so that light transmitted through portions of said substrate located between said recesses destructively interferes with light transmitted through said substrate and said optical phase-shifting material.

12. A method of forming a structure having high light transmittance regions, low light transmittance regions and light attenuating regions, the method comprising the steps of:

a) providing a substrate having first and second parallel major surfaces and a high light transmissivity;

b) coating said first surface with a light attenuating layer;

c) coating said light attenuating layer with a low light transmittance layer;

d) providing a first transfer layer on said low light transmittance layer;

e) forming an image in said first transfer layer to expose a selected area of said low light transmittance layer;

f) inspecting said image in said first transfer layer and correcting any errors in said image by adding material to, or removing portions of, said first transfer layer;

g) transferring said corrected image in said first transfer layer to said low light transmittance layer by removing said exposed selected area of said low light transmittance layer to expose said light attenuating layer in said selected area;

h) removing said first transfer layer including said added material;

i) inspecting said image transferred into said low light transmittance layer and correcting any errors in said transferred image in said low light transmittance layer by adding material to, or removing portions of, said low light transmittance layer;

j) transferring said corrected image in said low light transmittance layer to said selected area of said light attenuating layer by removing the light attenuating layer where exposed by said image in said low light transmittance layer; and k) providing a second transfer layer over said exposed selected area and said low transmittance layer;

l) forming a second image in said second transfer layer to expose said low transmittance layer in a second selected area;

m) inspecting said second image in said second transfer layer and correcting any errors in said second image by adding material to, or removing portions of, said second transfer layer;

n) removing said low light transmittance layer in said second selected area exposed by said second image including any said added material in the portions so removed, and o) removing said second transfer layer including said added material.

13. The method of claim 12 wherein said second image defines a boundary region around said second selected area whereby the step of removing said low light transmittance layer from the said area defined by said second image leaves a ring of low light transmittance material surrounding said second selected area on the surface of said attenuating layer.

* * * * *